United States Patent [19]
Yamazaki

[11] Patent Number: 5,272,361
[45] Date of Patent: Dec. 21, 1993

[54] FIELD EFFECT SEMICONDUCTOR DEVICE WITH IMMUNITY TO HOT CARRIER EFFECTS

[75] Inventor: Shunpei Yamazaki, Tokyo, Japan

[73] Assignee: Semiconductor Energy Laboratory Co., Ltd., Kanagawa, Japan

[21] Appl. No.: 785,201

[22] Filed: Nov. 1, 1991

Related U.S. Application Data

[63] Continuation of Ser. No. 538,082, Jun. 13, 1990, abandoned.

[30] Foreign Application Priority Data

| Jun. 30, 1989 | [JP] | Japan | 1-16848 |
| Jun. 30, 1989 | [JP] | Japan | 1-16851 |
| Jun. 30, 1989 | [JP] | Japan | 1-16852 |

[51] Int. Cl.$^5$ ............... H01L 29/04; H01L 31/072; H01L 27/01; H01L 29/76
[52] U.S. Cl. ............... 257/66; 257/192; 257/347; 257/410; 257/411
[58] Field of Search ............... 357/23.1, 23.7, 23.15; 257/66, 347, 348, 410, 411, 77, 192

[56] References Cited

U.S. PATENT DOCUMENTS

| 3,258,663 | 6/1966 | Weimer | 257/66 |
| 4,131,902 | 12/1978 | Kub | 357/23.15 |
| 4,507,673 | 3/1985 | Aoyama et al. | 357/23.15 |
| 4,722,913 | 2/1988 | Miller | 357/23.1 |
| 4,746,628 | 5/1988 | Takafuji et al. | 357/23.7 |
| 4,803,528 | 2/1989 | Pankove | 357/23.1 |
| 4,868,618 | 9/1989 | Kalnitsky et al. | 357/23.1 |
| 4,868,632 | 9/1989 | Hayashi et al. | 357/23.15 |
| 4,905,066 | 2/1990 | Dohjo et al. | 357/23.15 |
| 4,992,840 | 2/1991 | Haddad et al. | 357/23.15 |
| 5,019,882 | 5/1991 | Solomon et al. | 357/16 |
| 5,036,374 | 7/1991 | Shimbo | 357/23.15 |

FOREIGN PATENT DOCUMENTS

| 0291951 | 11/1988 | European Pat. Off. | 357/23.15 |
| 56-152270 | 11/1981 | Japan | 357/23.15 |
| 62-122275 | 6/1987 | Japan | 357/23.1 |
| 63-1072 | 1/1988 | Japan | 357/23.7 |
| 63-129669 | 6/1988 | Japan | 357/23.7 |
| 63-140580 | 6/1988 | Japan | 357/23.1 |

OTHER PUBLICATIONS

S. M. Sze, "Semiconductor Devices, Physics and Technology", Jan. 1985, p. 513.
Appl. Phys. Lett. 53(8), Aug. 22, 1988, "Gating of germanium surfaces using pseudomorphic silicon interlayers" by Vitkavage et al, pp. 692–694.
Appl. Phys. Lett. 54(21), May 22, 1989, "Amorphous silicon thin-film transistors with two-layer gate insulator" by Kim et al, pp. 2079–2081.
Appl. Phys. Lett. 54(7), Feb. 13, 1989, "Threshold voltage shift of amorphous silicon thin-film transistors by step doping" by Matsumoto et al, pp. 606–607.

*Primary Examiner*—Rolf Hille
*Assistant Examiner*—Steven Loke
*Attorney, Agent, or Firm*—Sixbey, Friedman, Leedom & Ferguson

[57] ABSTRACT

An improved field effect semiconductor device comprises source, drain and channel semiconductor regions and a gate electrode formed on the channel region through a gate insulating film. An intervening film is interposed between the channel region and the gate insulating film in order not to form a channel just below the gate insulating film. The intervening film is made, for example, from an amorphous silicon semiconductor whose energy gap is wider than that of the channel region made of polysilicon. By this structure, immunity to hot carrier effects can be given to the device.

25 Claims, 7 Drawing Sheets

FIELD EFFECT SEMICONDUCTOR DEVICE WITH IMMUNITY TO HOT CARRIER EFFECTS

This application is a continuation of Ser. No. 07/538,082, filed Jun. 13, 1990, now abandoned.

BACKGROUND OF THE INVENTION

1. Field of the Invention

The present invention relates to a field effect semiconductor device and a manufacturing method therefor and, more particularly to a field effect semiconductor device immune to hot carrier effects.

2. Description of the Prior Art

Recently, the advance of the technique of the large scale integration in the semiconductor field has been very significant. Along with demand for increased packing densities and high operation speeds, the dimmension of constituent elements become extremely small.

Because driving voltages required of semiconductor devices are not necessarily decreased in proportion to the element dimmension, several problems due to the fine structure appear to be solved from the view point of reliability. Hot carrier effect is one the difficult problems which dictate the limitation of the reliabilty in submicron-order devices. The average kinetic energy of carriers moving in a semiconductor is assumed to be $3kT/2$ using Boltzman constant $k$ and the absolute temperature $T$. These carriers receive energy from an electric field in which they are moving. The accepted excess energy, however, is usually dissipated into interaction with the lattice of the semiconductor to achieve thermal equilibrium. When the surrounding electric field substantially increases, hot carriers appear which have a larger average energy level than $3kT/2$ because accelation by the electric field overcomes alleviation by interaction with the lattice.

Such hot carriers appear in a position to which electric field is concentrated, for example, in the vicinity of a drain and gate insulating film of a field effect semiconductor device. Those carrier with enough energy to overcome the potential barriers of the gate insulating film are emitted into and trapped by the overlying gate oxide film. The trapped carriers form space charge and vary the characteristics of the device such as the threshold voltage or gm (mutual inductance), resulting in low reliability.

BRIEF SUMMARY OF THE INVENTION

It is an object of the present invention to provide a field effect semiconductor device having a high reliabilty and a manufacturing method for the same.

It is another object of the present invention to provide field effect semiconductor device immune to hot carrier effects and a manufacturing method for the same.

Additional objects, advantages and novel features of the present invention will be set forth in the description which follows, and in part will become apparent to those skilled in the art upon examination of the following or may be learned by practice of the present invention. The object and advantages of the invention may be realized and attained by means of the instrumentalities and combinations particularly pointed out in the appended claims.

To achieve the foregoing and other object, and in accordance with the present invention, as embodied and broadly described herein, an intervening film is formed between the gate insulating film and the underlying channel region of a field effect semiconductor device. The intervening film has forbidden energy band gap which is sufficiently wide not to form a channel therein in view of the underlying channel region when a gate voltage is applied but sufficiently narrow not to trap carriers emitted thereinto. By this structure, the emission of hot carrier is effectively prevented by the barrier of the intervening film.

The intervening film is made from materials whose band gaps are such that even when a gate control volatage is applied to the gate electrode the bottom of the valence band is not lowered below that of the channel region. The requirement is dependent upon the thickness of the intervening film as well as the band gaps of it and the underlying channel region. Namely, the constraint on the selection of the materials can be relaxed by decreasing the thickness of the intervening film to, e.g. 10 to 1000 angstroms. For example, even if the differential band gap between the intervening film and the channel region is only 0.2 eV or lower, the channel formation in the intervening film is prevented by decreasing the thickness of the intervening film to 10 to 200 angstroms.

BRIEF DESCRIPTION OF THE DRAWINGS

The accompanying drawings, which are incorporated in and form a part of the invention and, together with the description, serve to explain the principles of the invention.

FIGS. 5(A) and 5(8) are schematic diagrams showing an energy band structure of the field effect semiconductor device in accordance with a fourth embodiment of the present invention.

DETAILED DESCRIPTION OF THE PREFERRED EMBODIMENTS

Figure 1:
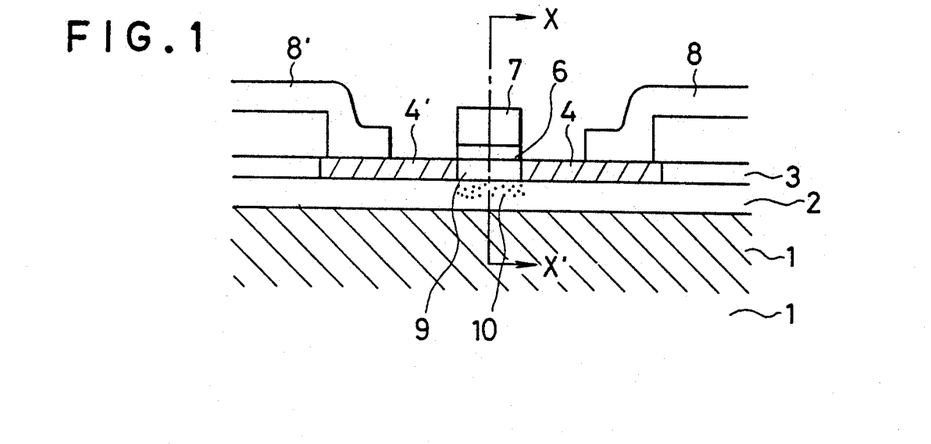
FIG. 1 is a cross sectional view showing a field effect semiconductor device in accordance with a first embodiment of the present invention.

Referring now to FIG. 1, a field effect semiconductor device in accordance with a first embodiment of the present invention is illustrated. The device is a thin film transistor called TFT for short. The transistor comprises an insulating substrate 1 such as a glass, ceramic, conductor or semiconductor substrate (pate or wafer) coated with an insulating film (e.g. a silicon nitride film), a narrow-gap semiconductor film 2 having a relatively narrow energy gap, a wide-gap semiconductor film 3 having a relatively wide energy gap, source and drain regions 4 and 4' of impurity semiconductor formed in the wide-gap semicondutor film 3 with an intervening region 9 therebetween, a gate insulating film 6 formed over the intervening region 9, a gate electrode 7 formed on the gate insulating film 6, and source and drain electrodes 8 and 8' contacting the source and drain regions 4 and 4' respectively. The narrow-gap semiconductor film may be made from a polycrystalline or single crystalline silicon semiconductor. The wide-gap semiconductor film may be made from an amorphous silicon semiconductor, a silicon nitride semiconductor, a silicon carbide semiconductor, a carbon semiconductor and so forth. The impurity semiconductor regions of the source and drain are formed so as to reach an upper portion of the narrow-gap semiconductor film 2 whereby carriers 10 move between the source and drain.

Figure 2A:
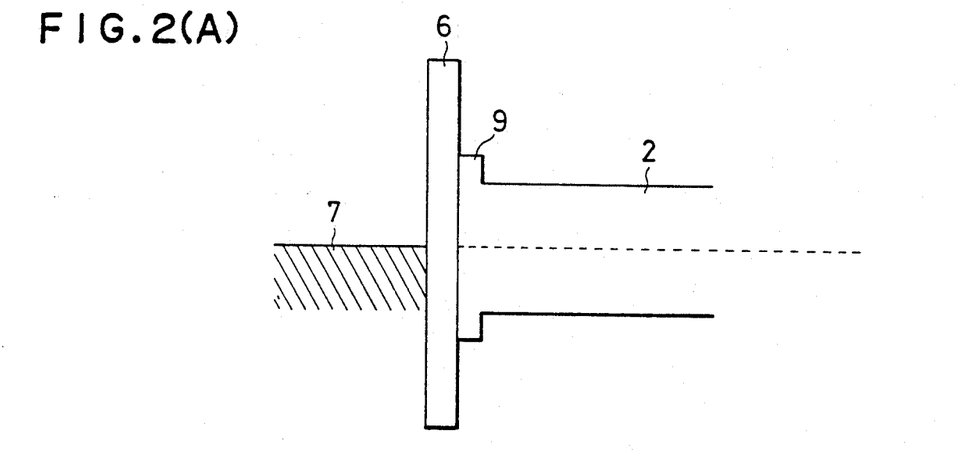
FIGS. 2(A) and 2(B) are schematic diagrams showing an energy band structure of the field effect semiconductor device shown in FIG. 1 when a gate is applied and not applied.
Figure 2B:
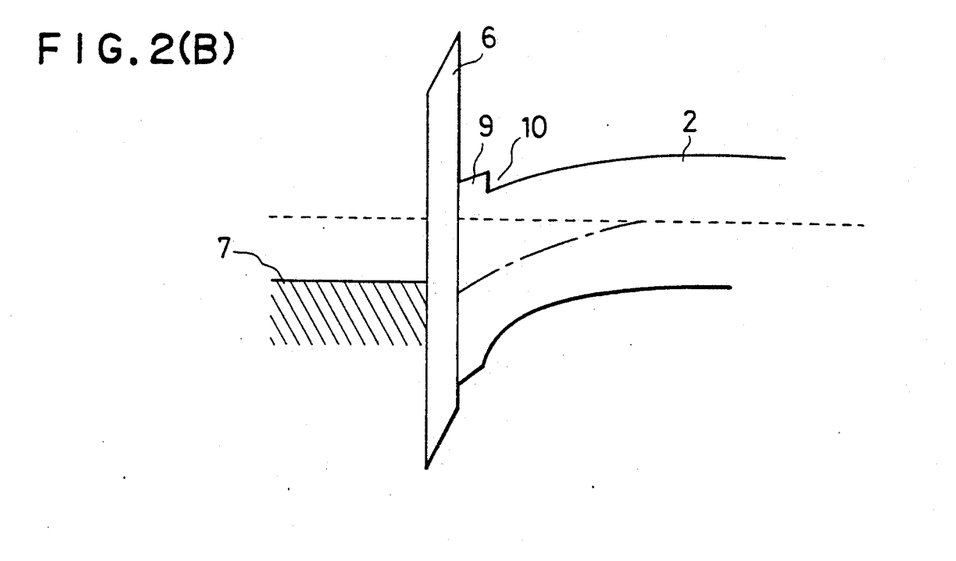
Figure 3A:
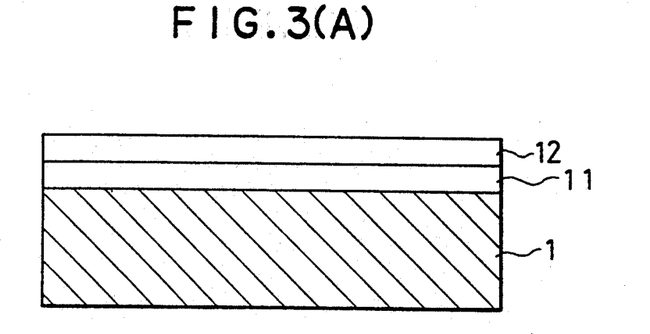
FIGS. 3(A) to 3(E) are cross sectional views showing a method of forming a field effect semiconductor device in accordance with the first embodiment of the present invention.
Figure 3B:
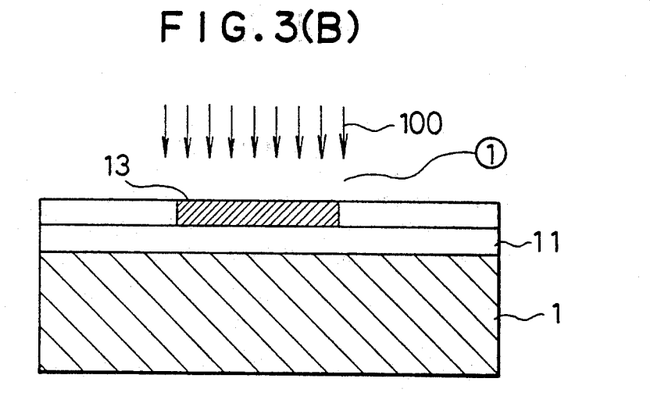
Figure 3C:
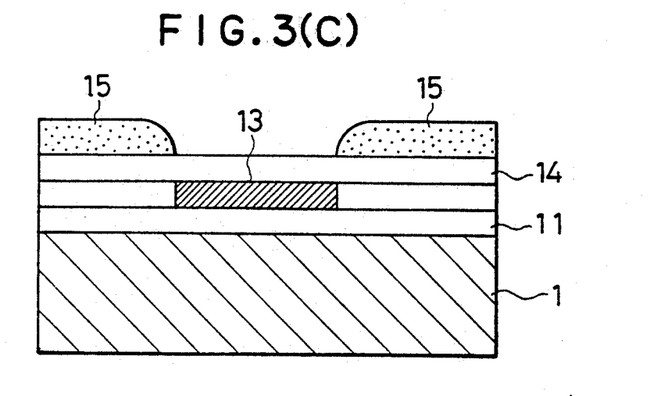
Figure 3D:
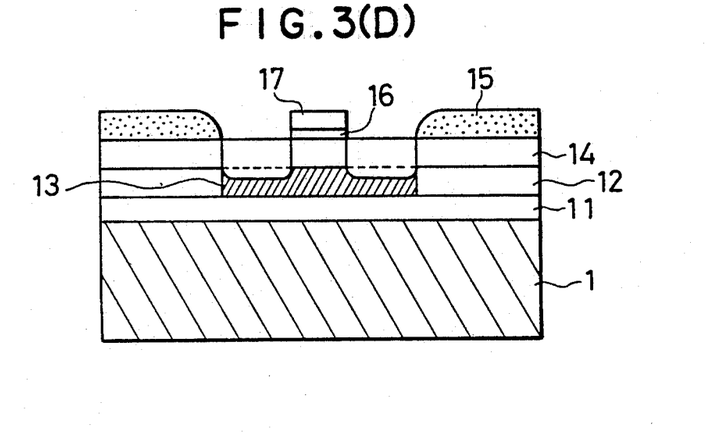
Figure 3E:
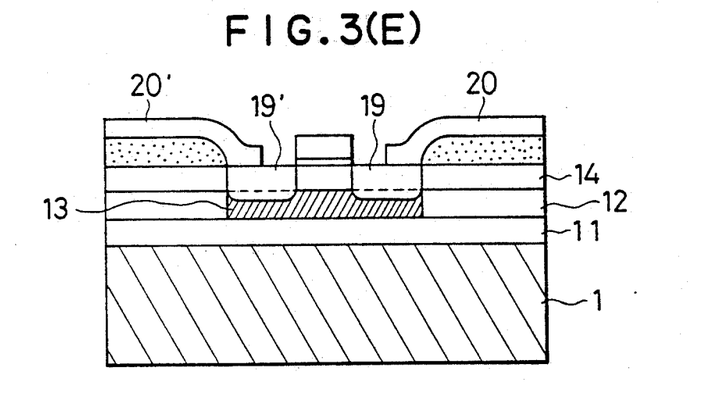

The energy band diagram along X—X pane is illustrated in FIGS. 2(A) and 2(8). The diagram is prepared for the case that the narrow-gap semiconductor film 2 is made from an intrinsic polysilicon semiconductor; the wide-gap semiconductor film 3 is made from an intrinsic amorphous silicon semiconductor; the gate insulating film is made from silicon oxide. FIG. 2(A) shows the energy band structure when no gate voltage is applied. FIG. 2(B) shows the energy band structure when a suitable positive gate voltage is applied to the gate electrode. As shown in FIG. 2(B), the lowest potential of the valence bands appears at the interface between the narrow gap semiconductor film 2 and the intervening region 9 of the wide-gap semiconductor film 3 since the bottom of the valence band of the narrow-gap semiconductor film 2 is lower than that of the wide-gap semiconductor film 3 in FIG. 2(A) and the difference can not be canceled even by the differential voltage level applied therebetween as shown in FIG. 2(B). Even if the difference in the band gap is not sufficiently wide to form a channel only in the narrow-gap semiconductor film 2, the formation of a channel in the wide-gap semiconductor film 3 can be avoided by decreasing the thickness of the narrow-gap semiconductor film 2. The combinational use of a crystalline semiconductor and an amorphous semiconductor for forming narrow and wide-gap semiconductor films is particularly advantageous because the carrier generation rate of the crystalline semiconductor is higher than that of the amorphous silicon semiconductor so as to help carriers to flow in the crystalline semiconductor film rather than amorphous semiconductor film. Namely, in this structure, hot carriers flow along the narrow-gap semiconductor film 2 just adjacent to the wide-gap semiconductor film 3 (9) apart from the gate insulating film 6. The hot carriers, therefore, can move free from fixed charge and trapping centers which may occur in the gate insulating film 6. Even if some hot carriers reach to the insulating film 6, the active energy thereof has to be substantially reduced by the differential energy potential between the bottoms of the valence bands of the narrow and wide-gap semiconductor films 2 and 3 so that adverse effects of the hot carriers can be negligible.

Next, an examplary method of manufacturing the transistor shown in FIG. 2 will be explained with reference to FIGS. 3(A) to 3(E). A Corning 7059 glass substrate 1 capable of resisting heat at 450 to 500 is cleaned with water. After the cleaning, the upper surface of the substrate 1 is exposed to ultraviolet light in an oxidizing atmosphere for 10 to 20 minutes in order to eliminate dust such as organic material adhering to the surface of the substrate, which can not be removed even by the water cleaning. The upper surface of the substrate 1 is then coated with a silicon nitride film 11 (not shown) of 1000 angstroms thickness by a plasma or photo CVD method. The purpose of the cleaning in two steps and the coating is to prevent any impurity from getting entered into a semiconductor film 12, to be deposited in the subsequent process, from the glass substrate 1.

On the silicon nitride film 11, an amorphous silicon semiconductor film 12 of 5000 angstroms is deposited in a plasma CVD chamber. The reactive gas is disilane. The input energy of RF power is 150 W. The pressure of the reactive gas during deposition is 0.15 Torr. The substrate temperature is maintained at 350 during the deposition in the chamber in order to help crytallization of the film 2. The silicon semiconductor film 12 is then exposed to laser pulses of 5 mm×10 mm cross section emitted from a KrF excimer laser at 15 pulses per second with a first mask. The wavelength is 248 nm. The energy density is 170 mJ/cm$^2$. The laser annealing is continued for 2.8 seconds. By virtue of the laser annealing, the semiconductor film 12 is partially crystallized by instantaneous heating to form a polycrystalline (narrow-gap) semiconductor film 13. In accordance with experiments, the grain diameters of the polycrystalline semiconductor film 13 was measured to be 800 to 1000 angstroms by a transmission electron microscope; the density of hydrogen in the film 13 was no higher than 1 atomic percent and therefore a high mobility of carriers was expected. When the annealing was continued for a longer time and the substrate was heated at the same time, the crystallinity of the semiconductor film was further promoted to be nearly single crystalline. The energy band gap was 1.23 eV.

Another amorphous silicon intrinsic semiconductor (wide-gap) film 14 is deposited again on the semiconductor film 13 by sputtering to a thickness of 10 to 200 angstroms, e.g. 80 angstroms. During the deposition, care is taken in order to exclude from the film undesirable hydrogen which tends to react with Si-O bonds in a gate insulating film to be formed in a following step and form surface energy levels therein. The deposition is carried out by, for example, sputtering of a Si target in argon. In accordance with experiment, the energy gap of the amorphous semiconductor film was 1.57 eV and the density of hydrogen was lower than those in usual amorphous silicon semiconductors.

The upper surface of the amorphous silicon semiconductor 14 is coated with a silicon oxide film of 1 micrometer thickness by CVD. The silicon oxide film is patterned with the first mask which has been used for the previous laser annealing in order to form insulating films 15 covering the silicon semiconductor film 14 except for the surface just above the laser annealed region 13. Next, a silicon nitride film of 60 angstroms thickness and a polycrystalline silicon film of 2000 angstroms thickness which is heavily doped with phosphorus are deposited by plasma CVD and patterned with a second mask in order to form a self-aligned gate electrode 17 and a gate insulating film 16 on the amorphous semiconductor film 14 between the insulating films 15. When the silicon nitride film was deposited by photo-CVD, the number of surface energy levels between it and the underlying semiconductor film 14 was reduced to $5.3 \times 10^{10}$ cm$^{-2}$.

Next, the structure is placed in the plasma CVD chamber. After evacuating the chamber to $10^{-5}$ Torr, PH$_4$ diluted with He at 3 % is introduced into the chamber. The pressure in the chamber is maintained at 0.07 Torr by controlling an evacuating means. A plasma is generated by applying high frequency electric energy at 200 W. Then, phosphorus is introduced into the semiconductor films through windows opened between the gate electrode 17 and the insulating films 15. This process is continued for 25 minutes in order to enter phosphorus through the thickness of the amorphous semiconductor film 14 and the upper portion of the polycrystalline semiconductor film 12 between the gate electrode 17 and the insulating films 15. Since the doped regions may not be sufficiently made active, however, laser annealing is effected thereto for 5 seconds by pulse application at 10 pulses per second. The energy density of the laser pulses is 120 mJ/cm$^2$. By the laser annealing, source and drain regions 19 and 19' are recrystallized and made more conductive.

Alternatively, the laser annealing can be carried out at the same time as the doping process of phosphorus in the plasma CVD chamber. In this case, the laser energy can be decreased to 50 mJ/cm$^2$ so that damage to the amorphous semiconductor film 14 is minimized. Next, a molybdenum film is deposited by a known sputtering method to a thickness of 3000 angstroms and patterned with a third mask to form source and drain electrodes 20 and 20'. After a sample device formed as described above was subjected to continuous operation for one month, there was observed little change in the threshold voltage and the gm. This means that the change in ten years will be limited within 4%.

Figure 4:
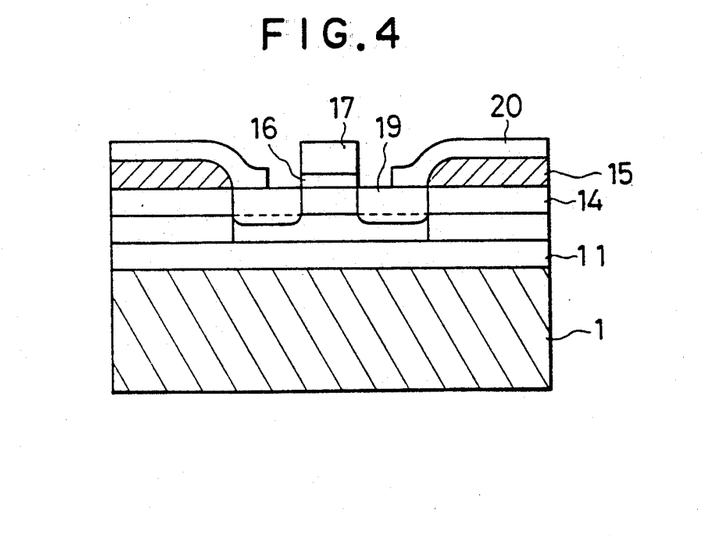
FIG. 4 is a cross sectional view showing a field effect semiconductor accordance with a second embodiment of the present invention.

A second embodiment will be explained in the following with reference to FIG. 4. This embodiment is manufactured in the same manner as the first embodiment explained in conjunction with FIGS. 3(A) to 3(D) except for those particularly described hereinbelow. In this embodiment, a silicon germanium semiconductor film 13 is deposited in place of the silicon semiconductor film by plasma CVD. The deposition is carried out at a substrate temperature of 280° C. with a reactive gas comprising SiH$_4$ and GeH$_4$ (Si:Ge=6:4). The input energy of RF power is 60 W. The pressure of the reactive gas is 0.1 Torr. The forbidden energy band gap of the silicon germanium semiconductor film thus deposited is about 1.36 eV. The energy gap is so low as not to need subsequent laser annealing. Since annealing is not carried out, a usual cheap sodalime glass pane can be used as the substrate 1 instead of the Corning 7059 glass substrate. The amorphous silicon semiconductor film 14 is deposited in the same manner as the first embodiment. The thickness is 60 angstroms and the energy gap is 1.67 eV.

A third embodiment will be described hereinbelow by way of the formation method, which can be explained with reference to FIGS. 3(A) to 3(D) in the same manner as the first embodiment. A Corning 7059 glass substrate 1 capable of resisting heat at 450° to 500° C. is cleaned with water and laser illumination and coated with a 1000 angstroms thick silicon nitride film 11 in Lhe same manner as the first embodiment. On the silicon nitride film 12, an amorphous silicon semiconductor film 12 of about 6000 angstroms is deposited in a plasma CVD chamber. The reactive gas is disilane containing a dopant gas of diborane at 10 to 100 ppm, e.g. 30 ppm. The doping of boron is performed in order to cancel out the inherent n-type conductivity exhibited by the amorphous semiconductor and to the film slightly of a p-type if necessary. The input energy of RF power is 150 W. The pressure of the reactive gas during deposition is 0.15 Torr. The substrate temperature is elevated to 350° during the deposition in the apparatus in order to help crytallization of the film 12. The threshold voltage of the field effect semiconductor device can be controlled by adjusting the amount of boron to be introduced in the film 12. The silicon semiconductor film 12 is then exposed to laser pulses of 250 micrometers × 150 micrometers cross section emitted from a XeCl excimer laser at 10 pulses per second by means of an optical system without the use of any mask. The wavelength is 308 nm. The energy density is 200 mJ/cm$^2$. The laser annealing is continued for 4 seconds. In accordance with experiments, the energy band gap was 1.23 eV.

A silicon carbide semiconductor (wide-gap) film 14 is deposited on the semiconductor film 13 by plasma CVD to a thickness of 200 angstroms, e.g. 80 angstroms. The reactive gas is disilane and methane at a volume ratio of CH$_4$/Si$_2$H$_6$=0.05. The input energy of RF power is 150 W. The pressure of the reactive gas during deposition is 0.13 Torr. The substrate temperature is elevated to 300° C. during the deposition. In accordance with experiment, the energy gap of the silicon carbide semiconductor film was 2.06 eV. In place of the silicon containing carbon, a silicon semiconductor containing nitrogen may be used.

Insulating films 15, a gate insulating film 16, a gate electrode 17, a source and drain regions 19 and 19' and source and drain electrodes 20 and 20' are formed in the same manner as the first embodiment using three photomask. The gate, source and drain electrodes, however, are made from a silicide such as tungsten silicide. Since silicide is a refractory material, thermal annealing to be given to the completed device can be carried out at a relatively high temperature, e.g. 500° to 600° C. In addition, since the resistivity of silicide is lower than that of polysilicon, the resistance of wiring is reduced and therefore the response speed of the device can be improved.

In accordance with the third embodiment, the differential width between the energy gaps of the wide-gap semiconductor film and the narrow-gap semiconductor film is substantially large as 0.81 eV. This large difference makes it possible to control the width of the wide-gap semiconductor film over a relatively wide range by which the threshold voltage can be controlled. The thickness of the wide-gap semiconductor film, however, may be up to 2000 angstroms from the practical view point.

Figure 5A:
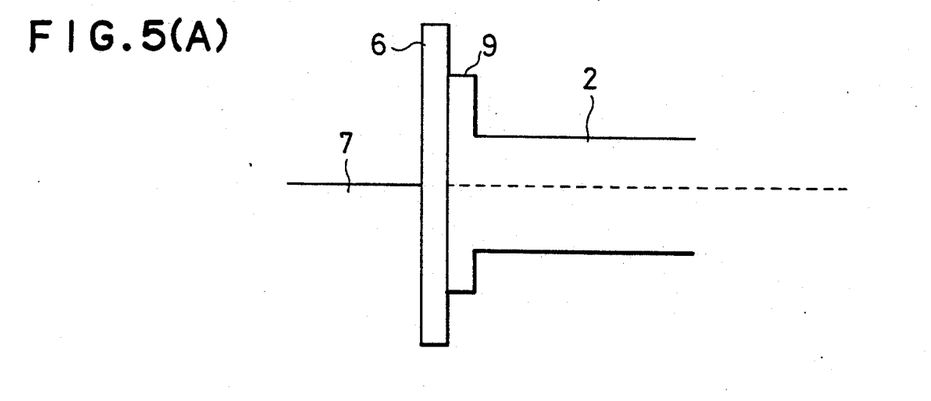
Figure 5B:
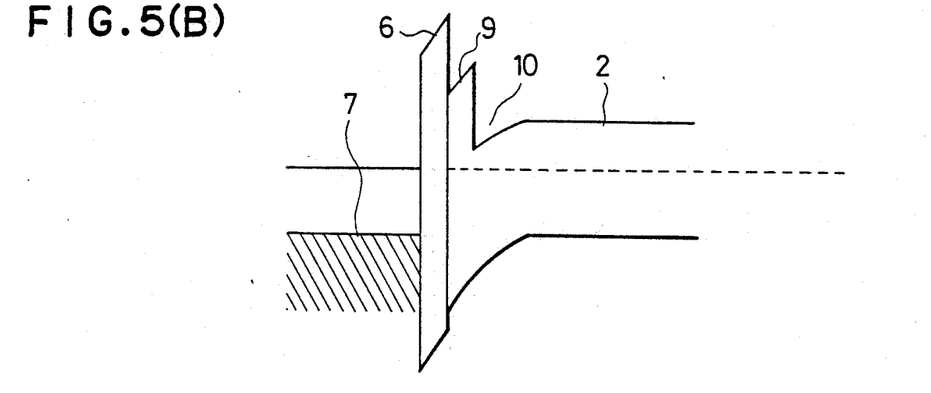

FIGS. 5(A) and 5(B) are diagrams showing the energy band structure of a field effect semiconductor device in accordance with a fourth embodiment of the present invention with and without application of a gate voltage. The structure of the device is not particularly shown because it is substantially same as the first embodiment shown in FIG. 1, which is used also for explanation of this embodiment. In this embodiment, the narrow-gap semiconductor film 2 is made from an n-type semiconductor. The operation is also substantially same as the first embodiment. Namely, a channel is formed only in the narrow-gap semiconductor film 12 and not in the wide gap semiconductor film 9 for the same reason. To form the narrow-gap semiconductor film from an impurity semiconductor (n-type or p-type) makes it possible to drive the device by a lower gate voltage. Also, the thickness of the wide-gap semiconductor film can be increased up to 2500 angstroms.

The description of a method of forming the second embodiment can also be made with reference to FIGS. 3(A) to 3(D) in the same manner as the first embodiment except for those particularly described in the following. Namely, since the narrow-gap semiconductor film 12 is of an n-type, the film 12 is deposited with a reactive gas of disilane including phosphine ($PH_3$) at 30 ppm. The deposition of the silicon nitride film 16 to be the gate insulating film is carried out to a thickness of 80 angstroms. The plasma treatment for the introduction of phosphorus is continued for 15 minutes.

A fifth embodiment is substantially same as the second embodiment except for the conductivity type of the narrow-gap semiconductor film. During the deposition of the narrow-gap semiconductor film, phosphine ($PH_3$) is introduced together with silane and germane in order to make the film of an n-type semiconductor.

Figure 6:
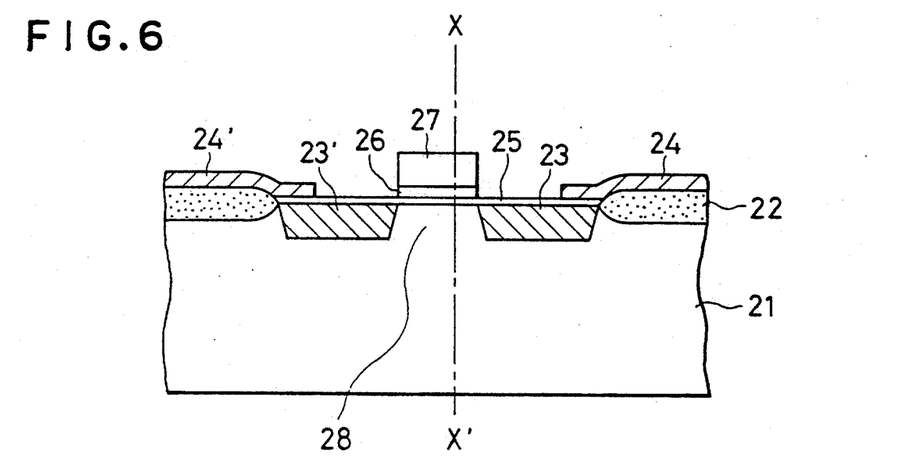
FIG. 6 is a cross sectional view showing a field effect semiconductor device in accordance with a sixth embodiment of the present invention.

FIG. 6 is a cross sectional view showing a semiconductor device (FET) in accordance with a sixth embodiment of the present invention. The device comprises a single crystalline silicon semiconductor substrate 21, source and drain regions 23 and 23' of impurity semiconductor formed within the semicondutor substrate 21, a channel region 28 located between the source and drain regions, separation insulating films 22 and 22' of local oxidation of silicon (LOCOS), an intervening insulating film 25 having a relatively low resistance coated over the source, drain and channel regions 23, 23' and 28, a gate insulating film 26 formed on the channel region 28 through the insulating film 25, a gate electrode 27 formed on the gate insulating film 26, and source and drain electrodes 24 and 24' contacting the source and drain regions 4 and 4' respectively through the insulating film 25. The insulating film 25 may be formed from silicon nitride ($Si_3N_{1\sim}$, e.g. $Si_3N_2$), silicon carbide ($SiC_{0.2-0.7}$ e.g. $SiC_{0.5}$), silicon oxide ($SiO_{0.5\sim1.5}$, e.g. SiO) and so forth as long as the resistivity is relatively low. The proportions of the silicon in silicon nitride and silicon oxide are chosen to be higher than those used for usual such compounds to decrease their resistivities.

Figure 7A:
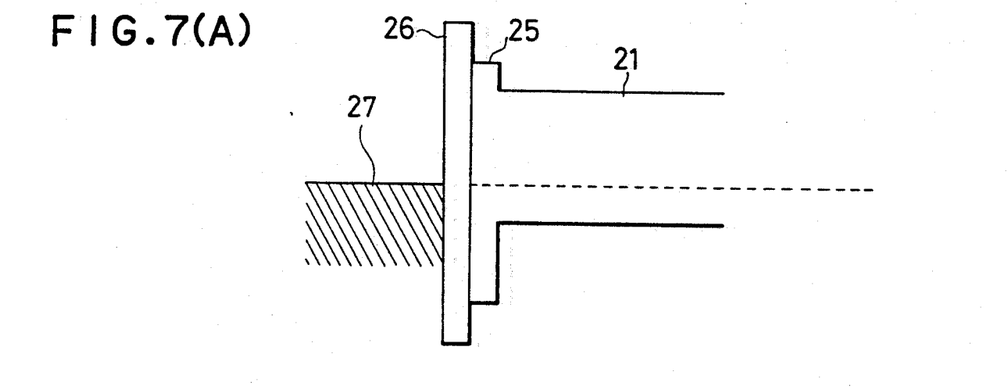
FIGS. 7(A) and 7(B) are schematic diagrams showing an energy band structure of the field effect semiconductor device shown in FIG. 6 when a gate voltage is applied and not applied.
Figure 7B:
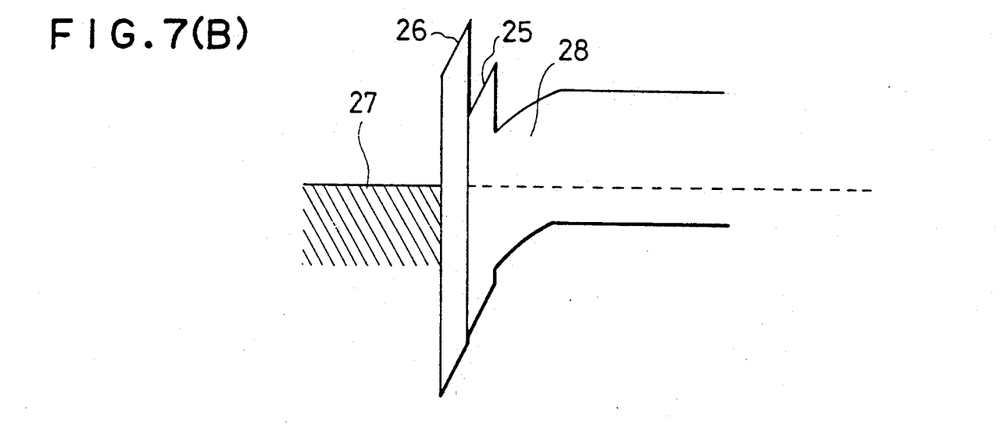

The energy band diagram along X—X plane is illustrated in FIGS. 7(A) and 7(B). The diagram is prepared for the case that the semiconductor substrate 21 is made from a p-type single crystaline silicon semiconductor and the insulating film 25 is made from silicon nitride. FIG. 7(A) shows the energy band structure when no gate voltage is applied. FIG. 7(B) shows the energy band structure when a suitable positive gate voltage is applied. As shown in FIG. 7(B), the lowest potential of the valence bands appears at the interface between the semiconductor substrate 21 and the intervening insulating film 25 in the same manner as in FIG. 2(8). In this embodiment, a channel is formed in the semiconductor substrate just adjacent to the insulating film below the gate insulating film.

Figure 8A:
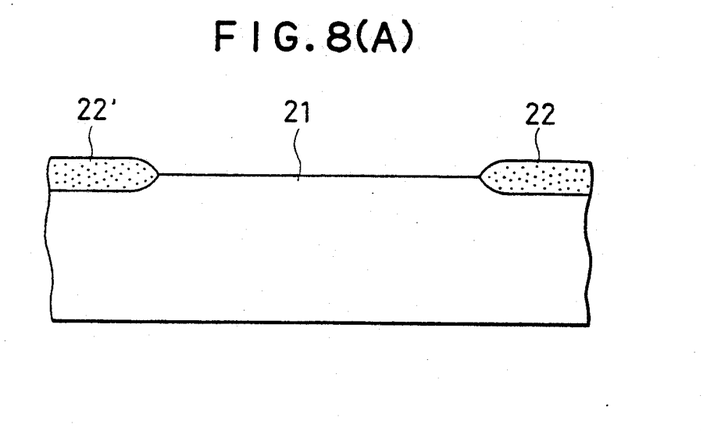
FIGS. 8(A) to 8(D) are cross sectional views showing a method of forming a field effect semiconductor device in accordance with the sixth embodiment of the present invention.
Figure 8B:
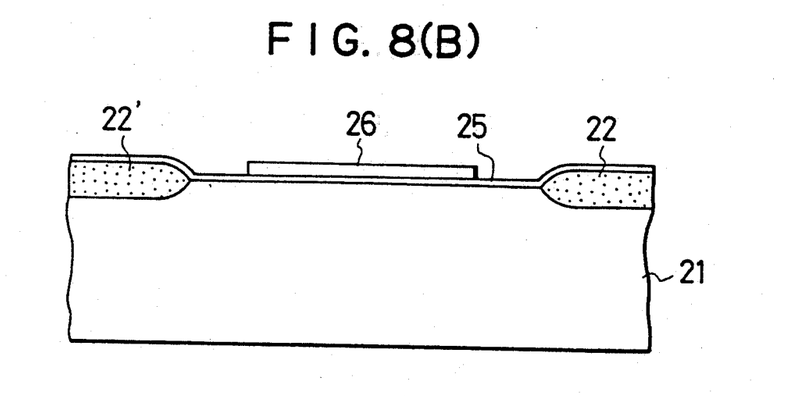

Next, an examplary method of manufacturing the semiconductor device as shown in FIG. 6 will be explained with reference to FIGS. 8(A) to 8(O). A p-type silicon semiconductor substrate 21 is coated with a 2000 angstroms thick silicon nitride film (not shown) by low-pressure CVD. After patterning of the silicon nitride film with a first mask, the substrate 1 is partially thermally oxidized at 1150° C. for 2 hours with the patterned silicon nitride film as a mask to grow separation insulating films 22 and 22' to a thickness of 1.5 micrometers followed by removal of the silicon nitride film by etching as shown FIG. 8(A). The upper surface of the substrate 1 is then coated with a silicon nitride film 25 of 100 angstroms by pasma CVD. The substrate temperature is maintained at 280° C. during deposition. The reactive gas comprises silane ($SiH_4$) and nitrogen ($N_2$). The input energy of RF power is 200 W. The pressure of the reactive gas during the deposition is 0.1 Torr. The proportion of nitrogen to silane is selected to be lower than that used in usual deposition of silicon nitride in order to lessen the resistivity of the silicon nitride film 25. The immunity of the silicon nitride film 25 to impurity drift, however, is maintained. During the deposition, care should be taken in order to exclude undesirable hydrogen which tends to react with Si-O bonds in a gate insulating film to be formed in a following step and form surface energy levels therein. Also, after the formation of the silicon nitride film, vacuum annealing, plasma treatment in an inert gas and the like process may be carried out in order to remove hydrogen from the film.

On the silicon nitride film 25, a silicon oxide film 26 is deposited by photo-CVD. The substrate temperature is 150°. The reactive gas comprises disilane ($Si_2H_6$) and oxygen ($O_2$). The input energy of ultraviolet light is 200 W. The pressure of the reactive gas during the deposition is 4.1 Torr. The silicon oxide film 25 is then patterned by a known photolithgraphy technique with a second mask to form gate insulating film 26 as shown in FIG. 9(8). The use of photo-CVD for depositing the gate insulating film is very advantageous because fewer surface energy levels are formed between the gate insulating film and the underlying semiconductor film by this deposition technique.

Figure 8C:
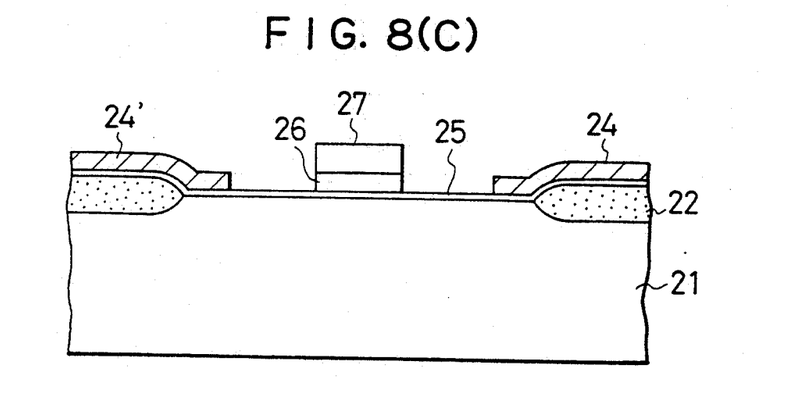

Then, a polycrystalline silicon film of 2000 angstroms is deposited by plasma CVD. The substrate temperature is maintained at 350° C. during deposition. The reactive gas comprises silane ($SiH_4$). The pressure of the reactive gas during the deposition is 3.0 Torr. The polycrystalline silicon film and the underlying silicon oxide film are patterned with a third mask of photoresist in order to form source and drain electrodes 24 and 24' and a self-aligned gate electrode 27 and an insulating film 26. The width of the gate electrode 27 is no less than 1.5 micrometers e.g. 0.8 micrometer.

Figure 8D:
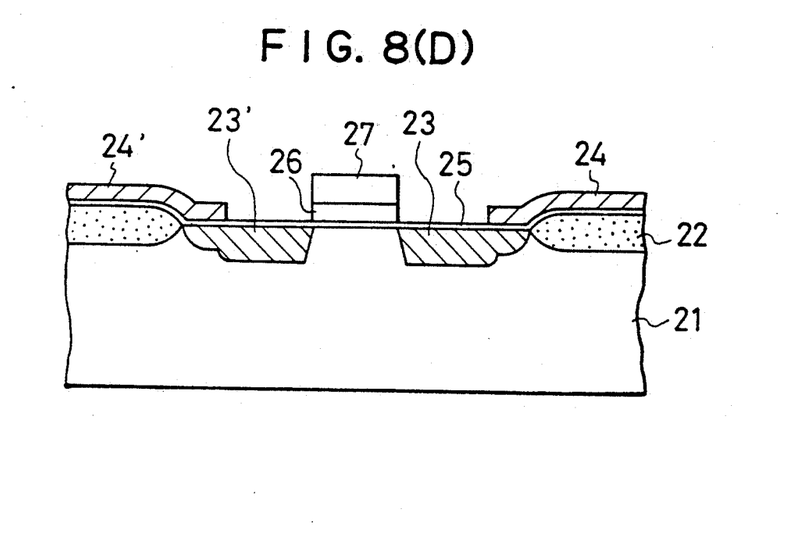

After removing the third mask, phosphorus ions are introduced into the semiconductor substrate 1 through the opening between the gate electrode 27 and the source and drain electrodes 24 and 24' by ion implantation. By the process, source and drain regions 23 and 25 are formed and the resistivity of the source, drain and gate electrodes is reduced. The structure is then subjected to annealing at 450° C. for 30 minutes to make the implanted impurity active. After a sample device formed as described above was subjected to continuous operation for one month, there was little change in the threshold voltage and the gm. This means that the change in ten years will be limited within 3 %.

Figure 9A:
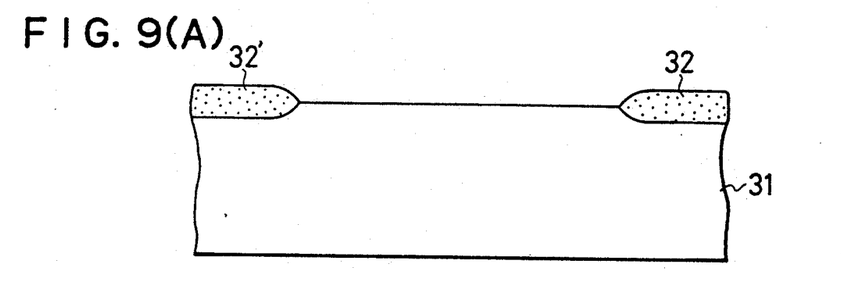
FIGS. 9(A) to 9(D) are cross sectional views showing a method of forming a field effect semiconductor device in accordance with the seventh embodiment of the present invention.
Figure 9B:
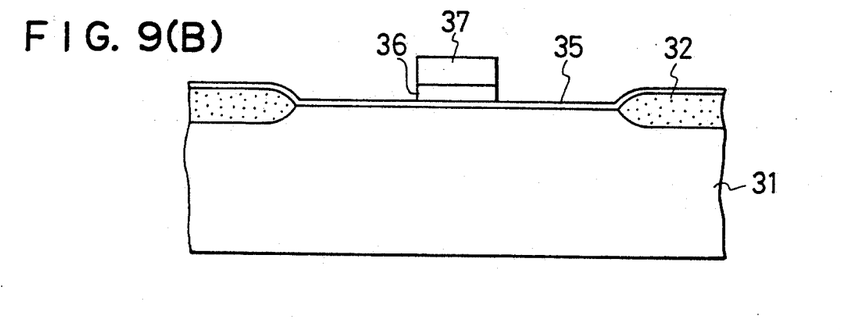

FIGS. 9(A) to 9(D) show a method of manufacturing the semiconductor device in accordance with seventh embodiment. A p-type silicon semiconductor substrate 31 is coated with a 2000 angstroms thick silicon nitride film (not shown) by low-pressure CVD. After patterning of the silicon nitride film with a first mask, the substrate 1 is partially thermally oxidized at 1150° C. for 2 hours with the patterned silicon nitride film as a mask to grow separation insulating films 32 and 32' to a thickness of 1.5 micrometers followed by removal of the silicon nitride film by etching as shown in FIG. 9(A). The upper surface of the substrate 31 is then coated with a silicon nitride film 35 of 100 angstroms by plasma CVD. The substrate temperature is 300° C. The reactive gas comprises silane ($SiH_4$) and nitrogen ($N_2$). The input energy of RF power is 200 W. The pressure of the reactive gas during the deposition is 0.1 Torr. The proportion of nitrogen to silane is selected to be lower than that used in usual deposition of silicon nitride in the same manner as the sixth embodiment. During the deposition, care should be taken in order to exclude undesirable hydrogen. Also, after the formation of the silicon nitride film, vacuum annealing, plasma treatment in an inert gas and the like process may be carried out in order to remove hydrogen from the film.

On the silicon nitride film 35, a silicon oxide film 36 is deposited by photo-CVD. The substrate temperature is 150° C. The reactive gas comprises disilane ($Si_2H_6$) and nitrous oxide ($N_2O$). The input energy of ultraviolet light is 600 W. The pressure of the reactive gas during the deposition is 5.0 Torr. Then, an n-type polycrystalline semiconductor silicon film of 2000 angstroms is deposited sequentially by low-pressure CVD. The substrate temperature is maintained at 350° C. The reactive gas comprises silane ($SiH_4$) and phosphine ($PH_3$). The pressure of the reactive gas during the deposition is 3.0 Torr. The polycrystalline silicon film and the underlying silicon oxide film are patterned with a second mask of photoresist in order to form a self-aligned gate electrode 37 and an insulating film 36 as shown in FIG. 9(B). The width of the gate electrode 37 is no less than 1.5 micrometers e.g. 0.9 micrometer.

Figure 9C:
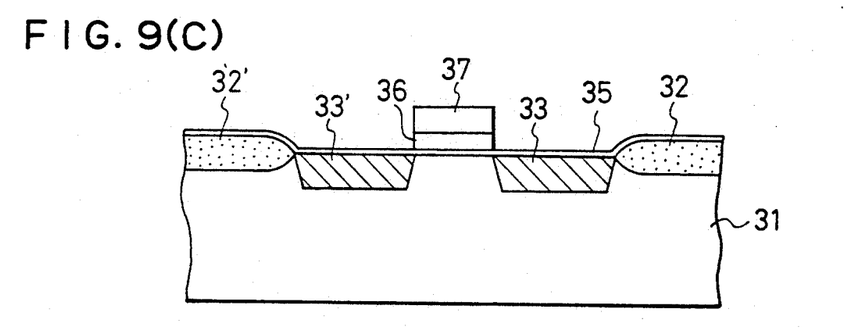
Figure 9D:
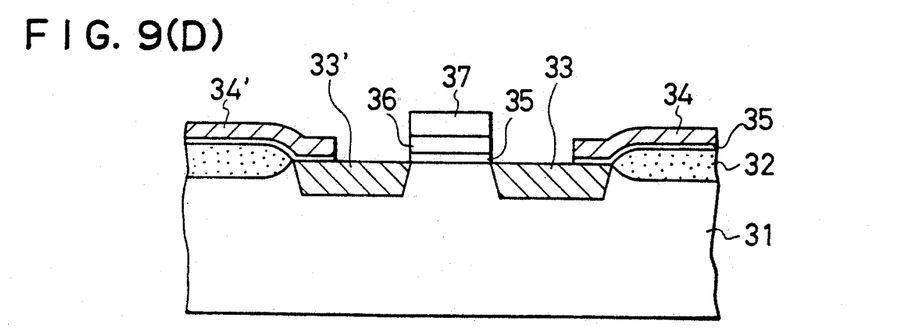

With the second mask, phosphorus ions are introduced into the semiconductor substrate 1 through the silicon nitride film 35 between the gate electrode 27 and the insulating films 35 by ion implantation. By the process, source and drain regions 33 and 33' are formed and the resistivity of the silicon nitride film 32 is reduced. The structure is then subjected to annealing at 450° C. for 30 minutes to make the implanted impurity active. Finally, an aluminum film of 3000 angstrom thickness is coated on the upper surface of the structure and patterned with a third mask together with the underlying silicon nitride film 35 in order to form source and drain electrodes 34 and 34'. Then, the formation of the device is completed as shown in FIG. 9(D). In accordance with this embodiment, the silicon nitride film 35 remains also between the source and drain electrodes and the underlying source and drain regions 33 and 33' and prevents undesirable aminum-semiconductor reaction therebetween so that a long-term reliability can be expected.

The foregoing description of preferred embodiments has been presented for purposes of illustration and description. It is not intended to be exhaustive or to limit the invention to the precise form described, and obviously many modifications and variations are possible in light of the above teaching. The embodiment was chosen in order to explain most clearly the principles of the invention and its practical application thereby to enable others in the art to utilize most effectively the invention in various embodiments and with various modifications as are suited to the particular use contemplated. Although in the above embodiments source and drain regions are formed by ion implantation or pasma treatment, other doping methods such as ion diffusion from a phosphosilicate glass can be used. The present invention is broadly applicable to general MOS FETs in the same manner as the thin film type transistors explained in the above description. If the intervening film is desired to be more thin, the upper surface of a semiconductor substrate can be directly subjected to chemical reaction to form in the surface an oxide, carbide or nitride film by plasma treatment, laser illumination or the like.

What is claimed is:

1. A field effect semiconductor device comprising:
   an insulating substrate;
   a crystalline semiconductor film formed on the substrate;
   an intervening film formed on said semiconductor film having an energy gap wider than that of the semiconductor film so that a channel region is formed within the semiconductor film;
   source and drain regions respectively formed within source and drain films were the source and drain films are formed on said semiconductor film and where the energy gaps of said source and drain films are wider than that of the semiconductor film;
   a gate insulating film formed on said intervening film located between said source and drain regions; and
   a gate electrode formed on said gate insulating film.

2. A field effect semiconductor device as in claim 1 wherein said source and drain films and said intervening film are portions of one film formed on the semiconductor film where the energy gap of the one film is wider than that of the semiconductor film.

3. A field effect semiconductor device as in claim 1 wherein said intervening film comprises a material selected from the group consisting of amorphous silicon, silicon nitride, silicon carbide, and silicon oxide.

4. A field effect semiconductor device as in claim 1 where the thickness of said intervening film is 10–1000 angstroms.

5. A field effect semiconductor device comprising:
   an insulating substrate;
   a crystalline semiconductor film formed on the substrate;
   an intervening film formed on said semiconductor film having an energy gap wider than that of the semiconductor film so that a channel region is formed within the semiconductor film;
   a source region formed within a source film and said semiconductor film where the source film is formed on said semiconductor film and where the energy gap of said source film is wider than that of said semiconductor film;
   a drain region formed within a drain film and said semiconductor film where the drain film is formed on said semiconductor film and where the energy gap of said drain film is wider than that of said semiconductor film and where the junction between the channel region and the drain region is at least within the semiconductor film;
   a gate insulating film formed on said intervening film located between said source and drain regions; and a gate electrode formed on said gate insulating film.

6. A field effect semiconductor device as in claim 5 wherein said source and drain films and said intervening film are portions of one film formed on the semiconductor film where the energy gap of the one film is wider than that of the semiconductor film.

7. A field effect semiconductor device as in claim 5 wherein said intervening film comprises a material selected from the group consisting of amorphous silicon, silicon nitride, silicon carbide, and silicon oxide.

8. A field effect semiconductor device as in claim 5 where the thickness of said intervening film is 10–10000 angstroms.

9. A field effect semiconductor device comprising:
a crystalline silicon semiconductor substrate;
a channel region formed within the substrate;
an intervening film formed on the channel region of said semiconductor substrate where the intervening film has an energy gap wider than the semiconductor substrate;
source and drain regions where the junction between the channel region and the drain region is within the semiconductor substrate;
a gate insulating film formed on said intervening film located between said source and drain regions where the gate insulating film has an energy band gap wider than the intervening film; and
a gate electrode formed on said gate insulating film.

10. A field effect semiconductor device as in claim 9 wherein said intervening film comprises a material selected from the group consisting of amorphous silicon, silicon nitride, silicon carbide, and silicon oxide.

11. The device of claim 10 wherein said silicon nitride is expressed by $Si_3N_{1-3}$.

12. The device of claim 10 wherein said silicon carbide is expressed by $SiC_{0.2-0.7}$.

13. The device of claim 10 wherein said silicon oxide is expressed by $SiO_{0.5-1.5}$.

14. A field effect semiconductor device as in claim 9 where the thickness of said intervening film is 10–1000 angstroms.

15. A field effect semiconductor device comprising:
a crystalline silicon semiconductor;
an intervening film formed on said semiconductor having an energy gap wider than the semiconductor so that a channel region is formed within the semiconductor where a step transition occurs in the energy gap at the interface between the intervening film and the semiconductor;
source and drain regions;
a gate insulating film formed on said intervening film located between said source and drain regions where the gate insulating film has an energy band gap wider than the intervening film; and
a gate electrode formed on said gate insulating film 16. A field effect semiconductor device as in claim 15 wherein said intervening film comprises a material selected from the group consisting of amorphous silicon, silicon nitride, silicon carbide, and silicon oxide.

17. A field effect semiconductor device as in claim 15 where the thickness of said intervening film is 10–1000 angstroms.

18. A field effect semiconductor device comprising:
a crystalline semiconductor;
a channel region formed within the semiconductor where the density of hydrogen in the channel region is no greater than one atomic percent;
an intervening film formed on the channel region of said semiconductor where the intervening film has an energy gap wider than the semiconductor;
source and drain regions;
a gate insulating film formed on said intervening film located between said source and drain regions; and
a gate electrode formed on said gate insulating film.

19. A field effect semiconductor device as in claim 18 wherein said intervening film comprises a material selected from the group consisting of amorphous silicon, silicon nitride, silicon carbide, and silicon oxide.

20. A field effect semiconductor device as in claim 18 where the thickness of said intervening film is 10–1000 angstroms.

21. A transistor comprising:
a substrate having an insulating surface;
a crystalline semiconductor layer comprising silicon formed on said surface;
a channel region formed within said semiconductor layer; and
a gate electrode formed adjacent to said channel region with a gate insulator therebetween;
wherein an intervening film is formed between said channel region and the gate insulator where the intervening film has an energy gap wider than said channel region; and
wherein the gate insulator has an energy gap wider than the intervening film.

22. The transistor of claim 21 wherein said intervening film comprises a material selected from the group consisting of amorphous silicon, silicon nitride, silicon carbide, and silicon oxide.

23. The transistor of claim 22 wherein said silicon nitride is expressed by $Si_3N_{1-3}$.

24. The transistor of claim 22 wherein said silicon carbide is expressed by $SiC_{0.2-0.7}$.

25. The transistor of claim 22 wherein said silicon oxide is expressed by $SiO_{0.5-1.5}$.

* * * * *